United States Patent [19]

Boudewijns

[11] Patent Number: 4,691,218

[45] Date of Patent: Sep. 1, 1987

[54] CHARGE TRANSFER DEVICE

[75] Inventor: Arnoldus J. J. Boudewijns, Eindhoven, Netherlands

[73] Assignee: U.S. Philips Corporation, New York, N.Y.

[21] Appl. No.: 8,112

[22] Filed: Jan. 23, 1987

Related U.S. Application Data

[63] Continuation of Ser. No. 607,903, May 7, 1984, abandoned.

[30] Foreign Application Priority Data

May 13, 1983 [NL] Netherlands ............... 8301715

[51] Int. Cl.$^4$ .................... H01L 29/78; G11C 19/28
[52] U.S. Cl. ........................................ 357/24; 377/62
[58] Field of Search .............. 357/24; 377/57–63

[56] References Cited

U.S. PATENT DOCUMENTS

| 4,125,785 | 11/1978 | MacLennan | 357/24 R |
| 4,125,786 | 11/1978 | MacLennan | 357/24 R |
| 4,131,950 | 12/1978 | van Santen | 357/24 L R |
| 4,376,897 | 3/1983 | Byrne | 377/63 |

OTHER PUBLICATIONS

Sequin "Two-Dimensional Charge-Transfer Arrays", IEEE J. Solid-State Circuits, vol. 5C-9 (6/74), pp. 134–142.

Primary Examiner—Gene M. Munson
Attorney, Agent, or Firm—Robert T. Mayer; Steven R. Biren

[57] ABSTRACT

A charge transfer device has a charge transfer channel and at least one second storage site situated outside this channel, whereby a connection channel for transferring charge packets is present between a first storage site situated in the charge transfer channel and the second storage site, which connection channel can be controlled by a transfer electrode. The transfer electrode is strip-shaped and extends in the longitudinal direction of the charge transfer channel. According to the invention, the transfer electrode essentially lies beside the charge transfer channel and has at the area of an end of the connection channel a projection which ensures satisfactory charge transfer from the storage site to the connection channel.

11 Claims, 6 Drawing Figures

FIG. 6

CHARGE TRANSFER DEVICE

This is a continuation of application Ser. No. 607,903, filed May 7, 1984, now abandoned.

BACKGROUND OF THE INVENTION

The invention relates to a charge transfer device comprising a semiconductor layer and a charge transfer channel belonging to the semiconductor layer and having first and second longitudinal sides and an electrode system comprising electrodes which are separated by a barrier layer from the charge transfer channel and which extend transversely across the charge transfer channel from one longitudinal side to the other, at least one of these electrodes being a first electrode which is associated with a first storage site present in the charge transfer channel, while there is present outside the charge transfer channel a second storage site which belongs to the semiconductor layer and has an associated second electrode separated by a barrier layer from this second storage site. The first and second storage sites each have a substantially rectangular periphery with a length and a width, which periphery is defined at least inter alia by the relevant associated first or second electode, the semiconductor layer comprising a connection channel which extends from the first to the second storage site and can be controlled by a transfer electrode which is separated by a barrier layer from the connection channel, said connection channel joining the first storage site on the first longitudinal side of the charge transfer channel, and the transfer electrode being strip-shaped and being arranged substantially parallel to the first longitudinal side beside the charge transfer channel charge carriers can be transferred through the connection channel between the first and the second storage sites from one storage site to the other, the connection channel having at an end adjoining the one storage site a width which is smaller than the length and smaller than the width of this one storage site, and the transfer electrode being separated from the first or second electrode associated with the one storage site.

Such a charge transfer device is known from U.S. Pat. No. 4,376,897. This known device is a series/parallel/series storage device composed of CCD shift registers. The input register is coupled to several parallel registers. Each parallel register is connected through a connection channel to a first storage site of the series register present beneath a first electrode, the connection channels being narrower than the width of the charge transfer channel of the series register. The series register is a 2-phase register, in which the first electrodes are located at a first level above the semiconductor body, while the intervals between these first electrodes are each bridged by a further electrode system. The further electrodes are located at a second level which is separated from the first level by an insulating layer. Each first electrode is connected to the adjacent further electrode and the electrode pairs thus formed are alternately connected to the different clock voltages. The first and the further electrodes extend transversely across the charge transfer channel of the series register, the first electrodes being longer than the further electrodes. These longer first electrodes extend not only across the said charge transfer channel, but also above the adjoining part of the respective connection channels and as far as underneath the edge of the strip-shaped transfer electrode. Other known charge transfer devices are shown in Japanese Kokai No. 54-150983 and Netherlands Pat. No. 7904406.

The present invention is based inter alia on the recognition of the fact that in the known structure described problems can readily arise during the transfer of information representing charge packets from the first to the second storage sites, so from the series register to the parallel registers, which problems become more serious as the connection channels are made narrower. Due to the proximity of the lateral boundary of the connection channels, at the entrance of these channels the potential well to be formed underneath the first electrode will be less deep than in the central part of the first storage site which is arranged centrally in the wider charge transfer channel of the series register. This effect becomes manifest during the transfer of charge carriers as a threshold, as a result of which charge carriers of the charge packet to be transferred can remain in the first storage site.

SUMMARY OF THE INVENTION

The present invention has for its object to provide a comparatively simply realizable solution for this problem, in which during the manufacture additional processing steps are not necessary.

According to the invention, a charge transfer device of the kind described above is characterized in that the strip-shaped transfer electrode has at the area of the connection channel a projection which extends at least substantially as far as the periphery of the one storage site.

It is often desirable that the first or second electrode associated with the one storage site and the transfer electrode join each other satisfactorily, that is to say at least with a certain overlap. As a result, particularly satisfactory charge transfer from the one storage site to the connection channel is obtained. In contrast with the charge transfer device described, in which the first electrode extends as far as underneath the transfer electrode and is thus located at the area of the overlap at a smaller distance from the connection channel than the transfer electrode, the device according to the invention is preferably so constructed that at the area of the overlap the transfer electrode and especially the projection of this electrode is located at a smaller distance from the connection channel than the first electrode.

In the device according to the invention, the potential in the connection channel can be controlled at any rate as far as the connection point to the one storage site by the transfer electrode due to the presence of the projection, as a result of which the said problem of the presence of a threshold can be avoided in a simple manner. An additional advantage is that, if the one storage site forms part of a charge transfer channel, the one storage site is practically limited to this charge transfer channel and does not extend into the adjoining connection channel. During the transport of charge packets through this charge transfer channel, practically all the charge carriers even of comparatively large charge packets consequently remain in the charge transfer channel and are not distributed, as in the known device described, over the charge transfer channel and the entrance part of the connection channel. Such a distribution of the charge carriers can adversely affect the transfer efficiency of the charge transfer through the charge transfer channel, especially at higher clock frequencies.

The transfer electrode may be connected to the second electrode and the transfer electrode and the second electrode may also be constructed as an integral part. Especially if the second storage site also has a width which is considerably larger than the width of the connection channel, in such a construction the storage of the charge packet will take place practically entirely in the second storage site during the transfer of charge carriers. At the narrow exit of the connection channel, in fact a threshold will also be formed in a similar manner as at the narrow entrance. The threshold at the exit of the channel in this case renders it difficult for charge carriers to flow back from the second storage site into the connection channel.

However, the transfer electrode is preferably separated not only from the first electrode, but also from the second electrode. The transfer electrode can then be controlled, while being separated from the first and second electrodes, as a result of which it is possible to store the charge packet temporarily in the connection channel during the transfer of charge carriers before the packet is transferred to the second storage site.

Advantageously, the transfer electrode at the area of the other end of the connection channel adjoining the other storage site likewise has a projection which extends at least practically as far as the periphery of this other storage site. As far as this other storage site also forms part of a charge transfer register, it is thus prevented that during the storage of large charge packets the charge will also be situated in part in the end of the connection channel. Moreover, this embodiment is suitable for transferring charge in both directions of the connection channel, which for given applications of charge transfer registers may be of importance.

The transfer electrode and the electrodes of the electrode system may be realized so as to be distributed over two levels. A particularly satisfactory transfer of the charge from the one storage site into the connection channel can then be obtained if the first electrode in the proximity of the end of the connection channel adjoining the first storage site has a widened part, whereas the electrodes of the electrode system adjoining on both sides the first electrode have near this end of the connection channel a narrowed part, which allows these adjoining electrodes and the transfer electrode with the projection to be arranged at the same level.

However, the transfer electrode and the electrodes of the electrode system are preferably realized so as to be distributed over at least three levels, the transfer electrode being associated with a first of these levels and the electrodes of the electrode system being arranged so as to be separated from this first level and to be distributed over the other levels.

The width of the projection may be freely chosen within wide limits. It has to be prevented that, when voltages are applied to the transfer electrode, undesired connections are formed between otherwise mutually separated charge packets stored in different storage sites of the charge transfer register. The width of the projection at the area of the end of the connection channel is preferably at most equal to the dimension measured substantially parallel to this width of the first or second electrode associated with the one storage site, while the width of the projection at the area of the end of the connection channel is advantageously at most equal to the width of this end.

The one storage site may be constituted by the first or by the second storage site. The one storage site may be associated with an image sensor element, in which electromagnetic energy is converted into a charge packet, the charge transfer register then serving to read the information represented by this charge packet. Further, the other storage site may be connected or coupled to a reading device for reading charge packets originating from the charge transfer register.

In an important preferred embodiment of the device according to the invention, the second storage site is present in a further charge transfer channel which belongs to the semiconductor layer, this further charge transfer channel extending substantially parallel to the said charge transfer channel in which the first storage site is situated.

In a further preferred embodiment of the device according to the invention, the other storage site is present in a charge transfer channel which belongs to the semiconductor layer, the end of the connection channel adjoining this other storage site having a width which is larger than the width measured in the transfer direction of the last-mentioned charge transfer channel of the first or second electrode associated with the other storage site. In this embodiment, the connection channel adjoins not only the other storage site, but at least also an adjacent storage site belonging to the same charge transfer register. Thus, inter alia the possibilities of a satisfactory transfer of charge from the connection channel into the receiving charge transfer register are increased.

In still another preferred embodiment of the device according to the invention, the projection extends from the strip-shaped part of the transfer electrode over a distance beyond the periphery of the one storage site, which distance is at most equal to about half the width of the connection channel at the area of the one end adjoining the one storage site. This means that the projection and the one storage site slightly overlap each other so that even if the relevant mask is not quite correctly aligned during the manufacture, a satisfactory transfer of the charge from one storage site into the connection channel is nevertheless ensured. The overlap in this case is so small that the quantity of charge which at most can be stored in the one storage site is only slightly reduced by this overlap.

BRIEF DESCRIPTION OF THE DRAWINGS

The invention will be described more fully with reference to several embodiments and the accompanying diagrammatic drawing, in which corresponding parts are designated as far as possible by the same reference numerals.

DESCRIPTION OF THE PREFERRED EMBODIMENTS

As a first embodiment, a part of a charge transfer device is described which, for example, may form part of a line or area image sensor device or of a memory. The charge transfer device shown in FIGS. 1 to 3 comprises a semiconductor layer 2 and a charge transfer channel 3 belonging to the semiconductor layer 2 and having a first longitudinal side 4 and a second longitudinal side 5 and an electrode system comprising electrodes 7, 8 and 9 which are separated by a barrier layer 6 from the charge transfer channel 3, which electrodes extend substantially from one longitudinal side to the other transversely across the charge transfer channel 3.

Figure 1:
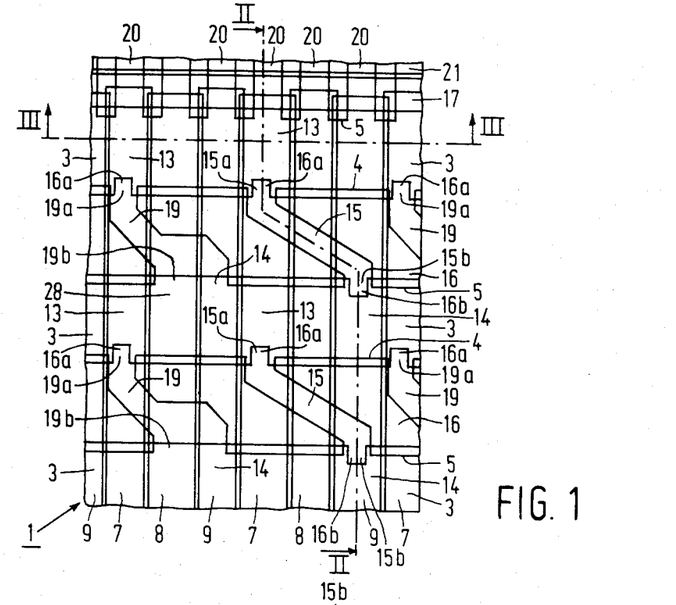
FIG. 1 is a plan view of a part of a first embodiment of a device in accordance with the invention.
Figure 2:
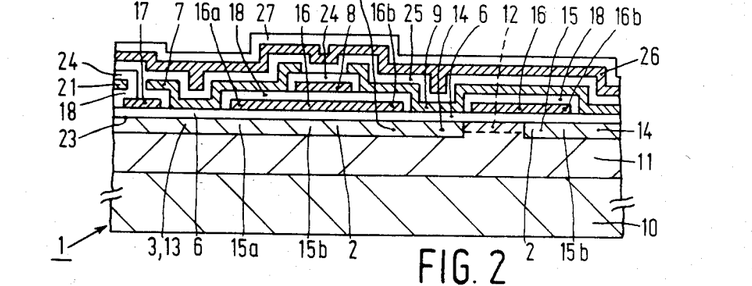
FIG. 2 and FIG. 3 are cross-sections not drawn to scale of this embodiment taken on the lines II—II and III—III, respectively, of FIG. 1.
Figure 3:
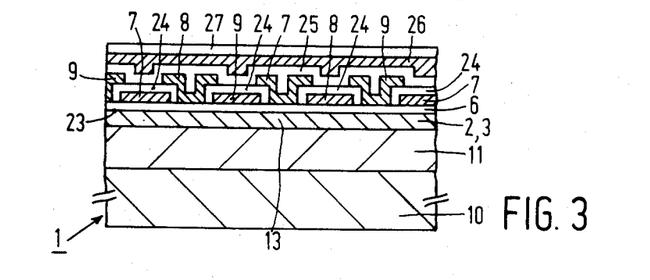

The charge transfer channel 3 and the electrode system comprising the electrodes 7, 8 and 9 form part of a charge transfer register of the type using bulk transport, which in the literature is also designated by BCCD or PCCD. The semiconductor layer 2 is a surface layer of a semiconductor body 1 further comprising a substrate region 10 of a given conductivity type, for example the n-type, and a semiconductor layer or a pocket 11 of the other opposite conductivity type. This p-type semiconductor layer 11 may be, for example, an epitaxial layer. The p-type semiconductor layer 11 or the p-type pocket 11 may also be obtained by implantation and/or diffusion. The semi-conductor layer 2 is formed in the p-type semiconductor layer 11. This semiconductor layer 2 is an n-type layer in which the storage and the transfer of information-representing charge packets take place. The stored and transferred charge carriers in this case are electrons.

At least one of the electrodes 7, 8, 9 of the said charge transfer register is a first electrode 7, which at least in part defines a first storage site 13 present in the charge transfer channel 3, a second storage site 14 belonging to the semiconductor layer 2 being present outside the charge transfer channel 3, which second storage site is defined at least in part by a second electrode 9 separated by a barrier layer 6 from this second storage site 14, the semiconductor layer 2 comprising a connection channel 15 which extends from the first storage site 13 to the second storage site 14 and can be controlled by a transfer electrode 16 separated by a barrier layer 6 from the connection channel 15.

In the present embodiment, the storage sites 13 and 14 are defined in part not only by means of the electrode 7 and the electrode 9, respectively, but also by means of the longitudinal sides 4 and 5 of the relevant charge transfer channel 3. The longitudinal sides 4 and 5 are determined for the major part by the lateral boundary of the n-type layer 2, in which storage and transfer of charge packets take place. As far as the longitudinal sides 4 and 5 do not coincide with this boundary of the n-type layer, the storage sites 13 and 14 are defined by means of the transfer electrodes 16 and 17.

It will be appreciated that the aforementioned definition or boundary of the storage sites relates to their extent in the layer direction of the semiconductor layer 2.

The first and the second storage site 13 and 14, respectively, each have a practically rectangular periphery with a length and a width and this periphery is defined inter alia by the relevant associated first or second electrode 7 or 9, respectively. In a vertical direction extending transversely to the said lateral direction, the storage sites 13 and 14 are defined by means of the thickness of the semiconductor layer 2.

For the sake of completeness, it should be noted that during operation of the charge transfer device the storage sites are constituted in fact by potential wells for electrons which are produced by means of potentials to be applied to the various electrodes and to the semiconductor region 11. Besides the aforementioned geometrical boundaries, these potentials to be applied are also determinative of the position and the extent of the actual storage sites situated in the semiconductor layer 2 and of the quantity of charge that can be stored therein.

The semiconductor layer 2 in which the storage and the transfer of charge takes place has one or more input and/or output contacts which are not shown in the Figures.

Dependent upon the chosen structure of the charge transfer device, other means may also be used for laterally defining the storage sites and hence for defining the circumference of the storage sites. For example, known means for incorporating potential thresholds may be used, such as differences in doping concentrations in the semiconductor layer, in which the storage and the transfer take place, differences in thickness of the insulating layer 6, differences in the quantity of incorporated charge in the insulating layer 6 and the use of different materials for the respective electrodes. In devices in which the charge transfer takes place along the semiconductor surface, lateral definition may also be realized by means of more highly doped channel-stopping semiconductor zones located outside the actual transfer channel. If desired, also in the present embodiment, more highly doped p-type channel-stopping surface zones 12 may be used in the p-type layer or pocket 11, along the lateral boundary of the n-type layer 2. In FIG. 2, such a surface zone 12 is indicated diagrammatically by a broken line between the two storage sites 14.

The transfer electrode 16 is strip-shaped and is arranged substantially parallel to the first longitudinal side 4 beside the charge transfer channel 3. In this case, the transfer electrode 16 is separated from the electrodes 7, 8 and 9 of the electrode system of the charge transfer channel which comprises the first storage site 13. In the present embodiment, the transfer electrode 16 is covered with an insulating layer 18, which separates this electrode from the remaining electrodes.

Charge carriers can be transferred through the connection channel 15 from the one to the other storage site and in this embodiment from the first storage site 13 to the second storage site 14, the connection channel having at an end 15a of this channel 15, which on the first longitudinal side 4 of the charge transfer channel 3 adjoins the first storage site 13, a width which is smaller than the length of the first storage site 13 and is smaller than the width of the first storage site 13, which width in this embodiment is equal to the distance between the two longitudinal sides 4 and 5 of the charge transfer channel 3 at the area of the first storage site 13. The entrance 15a of the connection channel 15 is therefore narrower than the width of the charge transfer channel 3 at the area of the joining of the connection channel 15. In practice this means that the entrance 15a is narrower than about 10 μm. In the present embodiment, the width of the end 15a is, for example, about 6 μm.

It has been found that in the known structure, in which as in FIG. 1 of the aforementioned patent, the entrance 15a of the connection channel 15 is located beneath the first electrode 7, during the transfer of charge from the first storage site 13 to the second storage site 14 charge is likely to remain in the first storage site 13 if the entrance 15a of the channel 15 is, for example, narrower than about 10 μm. It has further been found that the quantity of charge left behind increases as the entrance 15a is narrower. Nevertheless, it is of importance especially in devices in which a high information density is aimed at and in which therefore increasingly smaller dimensions are used, that connection channels having a narrow entrance can be used.

The fact indicated above that charge is left behind can be explained by the known narrow-channel effect. In general, the form of a potential well produced under an electrode will also be determined by the lateral boundary of the channel in which the potential well is produced. This edge effect will have only comparatively little influence with wider channels. On the contrary, with narrower channels, the maximum depth of the potential well will be influenced by this edge effect so that the conditions, such as equal doping concentrations and equal voltage at the electrode, being otherwise the same, the potential well produced will be deeper in a wide channel than in a narrow channel. In the situation shown at the transition from a comparatively wide storage location to a comparatively narrow connection channel, this means that at the entrance of the narrow channel in fact a potential threshold is present, which prevents a complete transfer of the charge packet in question.

The said potential threshold could be reduced or eliminated by means of a thickness adapted in situ of the insulating layer and/or a local adaptation of the doping concentration in the semiconductor layer 2. However, this requires additional processing steps during the manufacture, as a result of which the yield of the manufacturing process is adversely affected. In the whole manufacturing process, at least a number of these additional processing steps will moreover be among the more critical processing steps which require a comparatively high accuracy. Thus, the yield may be even further reduced.

According to the invention, the strip-shaped transfer electrode 16 at the area of each connection channel 15 has a projection 16a which extends at least as far as substantially the periphery of the one storage site and in this embodiment at least as far as the first longitudinal side 4 of the charge transfer channel 3. The projection 16a preferably extends slightly beyond the said longitudinal side 4 so that it projects above the charge transfer channel 3.

Thus, it is achieved that the potential well at the area of the entrance 15a of the connection channel 15 is controlled by the voltage at the transfer electrode 16 and is much less dependent upon the voltage at the first electrode 7 without comparatively critical processing steps being required for providing the transfer electrode 16. Moreover, no additional processing steps are required at all.

The use of projections 16a renders it possible to arrange the strip-shaped transfer electrode 16 for the major part beside the charge transfer channel 3 without the necessity of critically aligning with respect to the first longitudinal side 4. It is avoided that the strip-shaped base portion of the transfer electrode 16, that is to say the portion of the transfer electrode 16 which is left if the projections 16a and 16b should be removed, extends as far as above the charge transfer channel 3. If the transfer electrode 16 in fact should extend as far as above the charge transfer channel along its whole longitudinal side, connections would be formed between various storage sites of the charge transfer channel during the transfer of charge packets through the connection channels 15 along the first longitudinal side 4 of this charge transfer channel, as a result of which charge packets stored in these storage sites would not or not completely be separated from each other.

The embodiment has three parallel charge transfer registers which each have a charge transfer channel 3 and an electrode system comprising electrodes 7, 8 and 9. The first storage sites 13 situated beneath an electrode 7 of the register shown in FIG. 1 as the uppermost register are connected via a connection channel 15 or 19 to the second storage sites 14 which are situated beneath the electrode 9 and which in this embodiment belong to the second, the intermediate register. In a corresponding manner, first storage sites 13 of the intermediate register are connected via connection channels 15 or 19 to second storage sites 14 belonging to the lowermost register. Between the uppermost and the intermediate register and between the intermediate and the lowermost register there are arranged transfer electrodes 16 for controlling the connection channels 15 and 19.

The uppermost charge transfer register adjoins a number of parallel charge transfer channels 20, from which charge packets can be transferred to the uppermost register. Above these charge transfer channels 20 there is arranged a transfer electrode 17, while in FIG. 1 a further electrode 21 is partly visible. The charge transfer channels 20 are separated from each other by separation regions 22, which may be constituted, for example, by parts of the p-type semiconductor layer 11 extending up to the semiconductor surface 23.

The electrodes 7, 8, 9, 16, 17 and 21 are distributed over three levels. The electrodes 16 and 17 are arranged at a first level. These electrodes are separated from the semiconductor surface 23 by the insulating layer 6 and are covered with an insulating layer 18. The insulating layer 18 separates the electrodes 16 and 17 from the electrodes at the second level. The electrode 21 and half the number of electrodes 7, 8 and 9 belong to this second level. The other half of the number of electrodes 7, 8 and 9 belongs to the third level. These electrodes at the third level are separated from the electrodes at the second level by means of an insulating layer 24, which covers the electrodes at the second level. The electrodes at the third level are covered with an insulating layer 25, which in this embodiment is provided as a continuous insulating layer, which covers not only the electrodes at the third level, but also the intermediate parts of the insulating layer 24 not covered with electrodes at the third level. Otherwise, if desired, the insulating layers 18 and 24 may also be provided in the form of a continuous insulating layer and/or the insulating layer 25 may also be formed as a local layer obtained, for example, by oxidation of the relevant electrodes 7, 8 and 9.

If the charge trnasfer device forms part, for example, of a line or area image sensor, a light screen 26 not shown in FIG. 1 may also be provided over the insulating layer 24. This light screen 26 may be, for example, a layer of aluminum or of another suitable metal. This metal layer may also be used elsewhere in the device and outside the charge transfer registers shown to provide the aforementioned electrodes with an electrical connection in the form of conductor tracks which are connected to the electrodes at the various levels. Furthermore, for example, a protective insulating layer 27 may be provided over the metal layer 26.

The three charge transfer registers of the embodiment are 3-phase registers, in which the information supplied in parallel via channels 20 and constituted by information-representing charge packets can be distributed over the three charge transfer registers and then can be transferred simultaneously by these three registers. The first and second storage sites 13 and 14 which are interconnected through the channels 15 are situated beneath different electrodes. In the embodiment, these electrodes are the electrodes 7 and 9, but the second storage site 14 could also be situated, for example, beneath the electrode 8.

The exit 15b of the connection channels 15 will frequently have a width which is comparable with that of the entrance 15a and is smaller than the width of the adjoining second storage site 14. In this case, the strip-shaped transfer electrode 16 advantageously has also at the area of the exit 15b a projection 16b which extends as far as the exit 15b and preferably slightly beyond this exit 15b and as far as above the second storage site 14. Thus, it is achieved that also the exit end 15b is fully controlled by the transfer electrode so that it can be prevented that during the storage of large charge packets in the second storage site 14 a part of the charge carriers is stored in the end 15b of the connection channel 15.

A further advantage of this structure is that the connection channel 15 is suitable for transferring charge in both directions, which for certain applications of connection channels may be desirable.

The exit of the connection channel may also be wider than the entrance, as in the connection channels 19 of the embodiment. The entrance 19a of these channels 19 has approximately the same dimensions as the entrance 15a of the channels 15. The exit 19b is considerably wider than the exit 15b, however. At the area of the entrance 19a the transfer electrode 16 has a similar projection 16a as at the area of the entrance 15a. At the area of the exit 19b there is not provided a projection 16b because the narrow-channel effect, as far as it noticeably occurs at this exit, as described above, becomes manifest in a different and less disadvantageous number than at the entrance of the connection channel.

The exit 19b adjoins two storage sites, i.e. a second storage site 14 beneath the electrode 9 and an adjacent storage site 28 beneath the electrode 8. With the usual mode of operation of the device, a charge packet originating from the first storage site 13 indeed reaches as a whole the second storage site 14 before this charge packet is transported further along the relevant register in the transfer direction (which in FIG. 1 is supposed to be from the righthand side to the lefthand side).

The shape of the channel 19 also provides better possibilities of storing a charge packet during its transfer at an intermediate stage as a whole in the connection channel. For the sake of completeness it should be noted that in practice the connection channels between adjacent registers will mostly all have the same shape so that in a practical embodiment of the device channels 15 will be present.

The exit of the connection channel may also be wider than the entrance, as in the connection channels 19 of the embodiment. The entrance 19a of these channels 19 has approximately the same dimensions as the entrance 15a of the channels 15. The exit 19b is considerably wider than the exit 15b, however. At the area of the entrance 19a the transfer electrode 16 has a similar projection 16a as at the area of the entrance 15a. At the area of the exit 19b there is not provided a projection 16b because the narrow-channel effect, as far as it noticeably occurs at this exit, as described above, becomes manifest in a different and less disadvantageous manner than at the entrance of the connection channel.

The exit 19b adjoins two storage sites, i.e. a second storage site 14 beneath the electrode 9 and an adjacent storage site 28 beneath the electrode 8. With the usual mode of the operation of the device, a charge packet originating from the first storage site 13 indeed reaches as a whole the second storage site 14 before this charge packet is transported further along the relevant register in the transfer direction (which in FIG. 1 is supposed to be from the righthand side to the lefthand side).

The shape of the channel 19 also provides better possibilities of storing a charge packet during its transfer at an intermediate stage as a whole in the connection channel. For the sake of completeness it should be noted that in practice the connection channels between adjacent registers will mostly all have the same shape so that in a practical embodiment of the device channels 15 will be present at the area of the indicated channels 19 or conversely also channels 19 will be used instead of the indicated channels 15.

The device described may be operated, for example, as follows. The substrate region 10 and the p-type layer 11 are connected to voltages in a usual manner, the pn junction being biased in the reverse direction. The n-type layer 3 is completely depleted in such a manner that besides the electrons of the information-representing charge packets no free charge carriers are present therein. The electrodes 7 receive a positive clock pulse and the electrodes 16 and 17 also convey a suitable positive clock pulse. Information from the channels 20 adjoining the electrodes 7 is then stored beneath the electrodes 7 and beneath the upper transfer electrode 16. When the pulses at the electrodes 7 is eliminated, this information is situated as a whole beneath the upper transfer electrode 16. A positive clock pulse at the electrodes 9 and the elimination of the pulse at the transfer electrodes 16 result in that information being transferred into the uppermost register from the channels 20 adjoining the electrodes 9 and in the information taken up previously being shifted on to the intermediate register. With the occurrence of a pulse at the electrodes 7 the informations in both registers are shifted by one site to the right. Then again a pulse occurs at the transfer electrodes 16 and the pulse at the electrodes 7 is eliminated. With the occurrence of a pulse at the electrodes 8 again information can now be taken up from the channels 20. Subsequently, the pulse at the electrode 17 can be eliminated. All the channels 20 now have once transferred information to the uppermost register. Now a pulse occurs at the electrodes 9 and the pulse at the transfer electrodes 16 is eliminated, as a result of which the information in the uppermost register is shifted by one site to the right and charge present beneath the transfer electrodes 16 flows to the intermediate register and to the lowermost register, respectively. The information in the three series registers can then be transferred in a usual manner by these registers to the right, for example, to respective outputs of these registers. If desired, it may be achieved by means of a suitable adaptation of the length of the respective series registers that the information from the lowermost register becomes available at the output upon the occurrence of a pulse of the electrodes 7 and that the information from the intermediate and the uppermost register becomes available at the output upon the occurrence of the immediately succeeding pulse at the electrode 8 and upon the occurrence of the immediately succeeding pulse at the electrode 9, respectively.

For the sake of completeness it should be noted that in the mode of operation described above it is assumed that the suitable positive pulse at the transfer electrode 17 produces beneath this electrode a potential with an intermediate value, which prevents information flowing from the adjoining charge transfer channel 3 back to the channels 20.

The second embodiment has a semiconductor body 1 (FIG. 4 and 5) having a p-type substrate 11 and an n-type semiconductor layer 2 to which a charge transfer channel 3 belongs. The transfer direction in this charge transfer channel 3 is indicated by the arrow 30. The charge transfer register in question has an electrode system comprising electrodes 7, 8, 9 and 31 separated by a barrier layer 6 from the charge transfer channel 3. This register can be operated as a 4-phase register.

Figure 4:
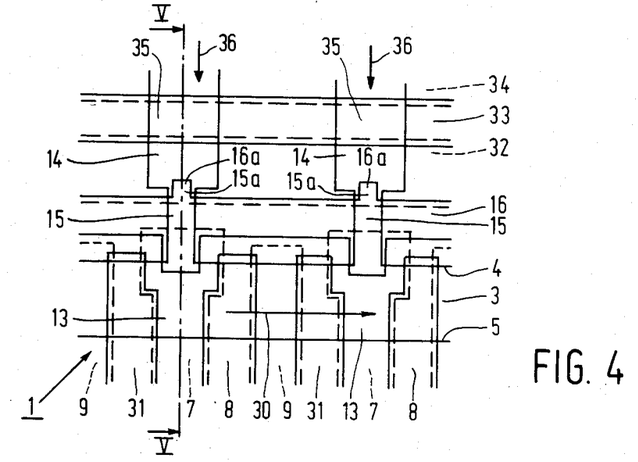
FIG. 4 is a plan view of a part of a second embodiment of a device in accordance with the invention.
Figure 5:
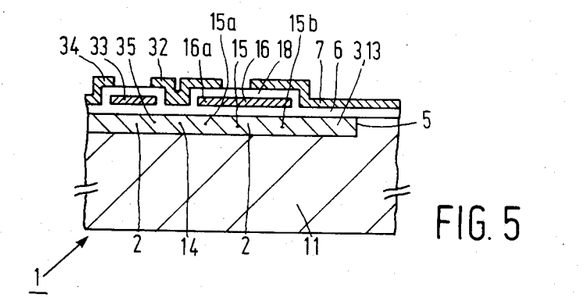
FIG. 5 shows an associated cross-section not drawn to scale taken on the line V—V of FIG. 4.

A number of storage sites of the 4-phase register are first storage sites 13, which have an associated first electrode 7. These first storage sites 13 are connected via connection channels 15 to charge transfer channels 35, which belong to charge transfer registers having an electrode system comprising electrodes 32, 33 and 34. The transfer direction of these transfer registers is indicated by arrows 36. Each of these charge transfer registers has a second storage site 14 and an associated second electrode 32, the second storage site 14 adjoining one of the connection channels 15. These connection channels 15 can be controlled by a transfer electrode 16 separated by the barrier layer 6 from these channels 15. The strip-shaped transfer electrode 16 is arranged substantially parallel to the first longitudinal side 4 beside the charge transfer channel 3.

In the present embodiment, charge carriers are transferred from the second storage sites 14 through the connection channels 15 to the first storage sites 13, the connection channels 15 each adjoining at an end 15a the second storage sites 14 at the periphery of these second storage sites. The width of the connection channels 15 at the area of the end 15a is smaller than the length and smaller than the width of the second storage site 14 and the transfer electrode 16 is separated from the second electrode 32.

The second storage site 14 has a substantially rectangular periphery with a length measured, for example, in the direction 36 of the charge transfer and a width then measured in a direction at right angles to the direction 36. The length of the second storage site 14 then approximately corresponds to the width of the strip-shaped second electrode 32, while the said width of the second storage site 14 corresponds to the distance between the longitudinal sides of the charge transfer channels 35.

The first storage site 13 also has a substantially rectangular periphery with a length determined by the width of the first electrodes 7 and a width corresponding to the distance between the longitudinal sides 4 and 5 of the charge transfer channel 3. Near the exit 15b of the connection channels 15 the electrodes 31 and 8 are slightly narrowed and the electrodes 7 are correspondingly widened. Thus, a sufficiently large space has been obtained to realize the electrodes 31, 8 and 16 at the same level. These electrodes can therefore be formed from the same conducting layer. Within the scope of the present invention, the storage site 13, also when provided with a widened part as described above, is considered as a substantially rectangular storage site having a substantially rectangular periphery. Where this is applicable, in case such an adaptation of the geometry has been effected near the entrance of the connection channel, the terms width or length of the storage site used above are to be understood to mean the average length or the average width.

The first layer of conductor tracks or electrodes 33, 16, 31, 8 is covered with an insulating layer 18, which separates these electrodes at the first level from the electodes 7, 9, 32 and 34 at the second level. Also in this embodiment, the transfer electrode 16 is separated both from the second electrode 32 and from the first electrode 7. Within the scope of the present invention, such a fully separate transfer electrode 16 is to be preferred.

Further, the transfer electrode 16 preferably belongs to the first level of electrodes or conductor tracks so that, as far as the first and/or the second electrode overlaps the transfer electrode at the area of the overlap is located at a smaller distance from the semiconductor surface 23 than the first and/or the second electrode. However, the transfer electrode 16 may alternatively be realized at a higher level provided that no electrode is present above the connection channel at a lower level between the transfer electrode and the connection channel.

The third embodiment also has a charge transfer register including a charge transfer channel 3 (FIG. 6) and an electrode system comprising electrodes 7, 8, 9 and 31. The first storage sites 13 of this charge transfer registers are connected via channels 15 to second charge storage sites 14. The first charge storage sites 13 are situated beneath first electrodes 7 and with the second charge storage sites 14 is associated a second electrode 16 which is integral with or is at least connected to the transfer electrode. According to the invention, the transfer electrode 16 has projections 16a at the area of the connection channels 15, which projections extend at least as far as the periphery of the adjoining one charge storage site, which in this embodiment is constituted by the first storage site 13. The projections 16a extend slightly beyond the first longitudinal side 4 and as far as above the charge transfer channel 3. Thus, charge carriers can be transferred effectively from the first charge storage sites 13 of the charge transfer channel 3 to the second storage sites 14.

Figure 6:
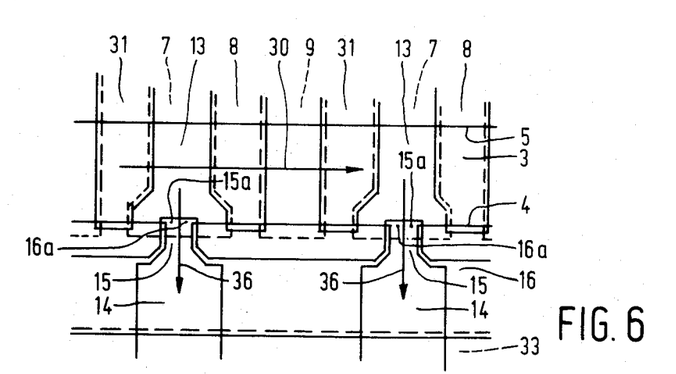
FIG. 6 is a plan view of a part of a third embodiment of a device in accordance with the invention.

The strip-shaped transfer electrode 16 is arranged along the first longitudinal side 4 beside the charge transfer channel 3 and at the same time constitutes, as described, the second electrodes associated with the second storage sites 14. On the side of the second storage sites 14 remote from the connection channels 15 there may be present a further electrode 33 if the second storage sites form part, for example, of charge transfer registers. Further, for example, a reading device for reading information-representing charge packets may succeed the second storage sites 14.

In order to be able to realize the electrodes 31, 8 and 16 at the same level, the electrodes 31 and 8 also in this embodiment have a narrowed part, as a result of which a sufficiently large space is available for the projections 16a. The electrodes 13 realized at the second level have a corresponding widened part at the area of the connection channels 15. The electrodes 9 are also realized at the second level.

Although the transfer electrodes and the electrodes of the charge transfer register of the first storage site or sites may be realized at two levels, these electrodes are preferably distributed, as indicated in the first embodiment, over at least three levels, the transfer electrode being realized at the first level and the electrodes of the charge transfer register being realized at the second and the third level and, as the case may be, at a still further level. In case an electrode at the first level and an electrode at one of the other levels overlap each other, the first-mentioned electrode will be generally located in situ at a smaller distance from the semiconductor surface than the last-mentioned electrode.

The second storage site 14 need not form part of a charge transfer channel. For example, the charge storage sites 14 of the second embodiment may succeed sensor elements sensitive to radiation, such as diodes. Thus, electromagnetic radiation may be converted into an electrical charge pattern, which is stored in the form of charge packets in the second storage sites 14 and can be read by means of the charge transfer register having the charge transfer channel 3 in an otherwise usual manner.

However, both the first and the second storage site preferably form part of a charge transfer register having a charge transfer channel. The use of the present invention is then especially advantageous if the two charge transfer channels, as in the first embodiment, are arranged substantially parallel to each other.

As described above, it is advantageous for the projection to extend from the strip-shaped part of the transfer electrode over a certain distance beyond the longitudinal side of the charge transfer channel or more generally beyond the periphery of the one storage site. The said distance is preferably at most equal to about half the width of the connection channel at the area of the one end adjoining the one storage site. In this manner, a satisfactory charge transfer from the one storage site to the connection channel is ensured, whereas on the other hand the effective storage capacity of the one storage site is only slightly reduced by the presence of the joining of the connection channel because only a small part of this one storage site is covered by the projection. The projection should extend on the one hand over a sufficient distance to ensure a satisfactory connection between the one storage site 13 and the connection channel 15 and should on the other hand project over such a small distance above the charge transfer channel that the potential variation along the longitudinal side of the charge transfer channel is only slightly varied by the presence of the connection channel 15. Taking into account the uncertainty due to the alignment of the mask for the transfer electrode 16 with respect to the logitudinal side of the charge transfer channel, the projection 16a will extend in practice over a distance of 1 to 3 μm beyond the longitudinal side 4.

It has also already been indicated that by the use of the projection it is possible to prevent undesired connections between adjacent charge packets present in the charge transfer register being formed along the edge of the charge transfer channel 3. In this connection the width of the projection is generally to be chosen smaller than twice the width of the electrode 7 associated with the storage site 13. The width of the projection at the area of the relevant end of the connection channel is preferably at most equal to the dimension (mostly the width) measured practically parallel to this width of the first or second electrode associated with the one storage site, while very favorable practical results were obtained with a projection whose width at the area of the end of the connection channel was at most equal to the width of this end of the connection channel.

It will be appreciated that the present invention is not limited to the embodiments described and that within the scope of the invention many variations are possible for those skilled in the art. The manufacture of the embodiments described can be effected wholly in a conventional manner using processing steps and techniques known to those skilled in the art. Instead of silicon other semiconductor materials, such as germanium or $A^{III}B^{V}$ compounds, may be used. Furthermore, the invention can be used not only in charge transfer devices of the type using bulk transport but also in charge transfer devices in which the charge transfer takes place along the semiconductor surface. As material for the insulating layers use may be made not only of silicon oxide, but also, for example, of aluminum oxide or silicon nitride; also mixtures or double layers of different insulating materials may be utilized. The electrodes may consist of a suitable metal, such as aluminum, or of an alloy, or they may be composed of layers of different conducting materials. Furthermore, electrodes of polycrystalline or amorphous semiconductor materials may be provided, and such electrodes may be converted, if desired, over their whole thickness or over a part thereof into a metal silicide, or they may consist of a suitable silicide. The indicated conductivity types may be interchanged. The barrier layer separating the electrodes from the charge storage site or the connection channel may be constituted not only by an insulating layer, but also be a rectifying junction which is then operated in the reverse direction.

What is claimed is:

1. A charge transfer device comprising a semiconductor layer and a charge transfer channel associated with the semiconductor layer and having first and second longitudinal sides, a barrier layer on said charge transfer channel, and an electrode system comprising electrodes which are separated by said barrier layer from the charge transfer channel and which extend transversely across the charge transfer channel from one longitudinal side to the other, at least one of said electrodes being a first electrode which is associated with a first storage site present in the charge transfer channel, a second storage site located outside the charge transfer channel which belongs to the semiconductor layer and has an associated second electrode separated by the barrier layer from said second storage site, the first and second storage sites each having a substantially rectangular periphery having a length and a width, which periphery is defined at least in part by the relevant associated first or second electrode, the semiconductor layer comprising a connection channel which extends from the first to the second storage site, a transfer electrode which is separated by the barrier layer from the connection channel, said connection channel being controlled by said transfer electrode, said connection channel joining the first storage site on the first longitudinal side of the charge transfer channel, the transfer electrode being strip-shaped and being arranged substantially parallel to the first longitudinal side beside the charge transfer channel, charge carriers being transferred in operation through the connection channel between the first and second storage sites from one storage site to the other, the connection channel having at an end adjoining the one storage site a width which is smaller than both the length and the width of the one storage site, and the transfer electrode being separated from the first or second electrode associated with the one storage site, characterized in that the strip-shaped transfer electrode has a strip-shaped main part and a projection located at the area of the connection channel, which projection juts out from the strip-shaped main part and extends from said main part at least substantially as far as the periphery of the one storage site.

2. A charge transfer device as claimed in claim 1, in which the first or second electrode associated with the one storage site and the transfer electrode overlap each other, characterized in that at the area of the overlap the projection of the transfer electrode is located at a smaller distance from the connection channel than the electrode associated with the one storage site.

3. A charge transfer device as claimed in claim 1 or 2, characterized in that the transfer electrode is also arranged so as to be separated from the electrode associated with the other storage site.

4. A charge transfer device as claimed in claim 3, characterized in that the transfer electrode at the area of the other end of the connection channel adjoining the other storage site likewise has a projection which extends at least as far as substantially the periphery of this other storage site.

5. A charge transfer device as claimed in claim 1 or 2, characterized in that the transfer electrode and the electrodes of the electrode system are distributed over two levels, the first electrode having a widened part near the end of the connection channel adjoining the first storage site and the electrode of the electrode system adjoining on both sides the first electrode having a narrowed part near the end of the connection channel, so that these adjoining electrodes and the transfer electrode with the projection are arranged at substantially the same level.

6. A charge transfer device as claimed in claim 1 or 2, characterized in that the transfer electrode and the electrodes of the electrode system are realized so as to be distributed over at least three levels, the transfer electrode belonging to a first of these levels and the electrodes of the electrode system being arranged so as to be separated from this first level and to be distributed over the remaining levels.

7. A charge transfer device as claimed in claim 1 or 2, characterized in that the projection at the area of the end of the connection channel has a width which is at most equal to the dimension measured substantially parallel to this width of the first or second electrode associated with the one storage site.

8. A charge transfer device as claimed in claim 1 or 2, characterized in that the projection at the area of the end of the connection channel has a width which is at most equal to the width of this end.

9. A charge transfer channel as claimed in claim 1 or 2, characterized in that the second storage site is situated in a further charge transfer channel which belongs to the semiconductor layer, this further charge transfer channel extending substantially parallel to the said charge transfer channel in which the first storage site is situated.

10. A charge transfer device as claimed in claim 1 or 2, characterized in that the other storate site is situated in a charge transfer channel which belongs to the semiconductor layer, the other end of the connection channel joining this other storage site having a width which is larger than the dimension measuring in the transfer direction of the last-mentioned charge transfer channel of the first or second electrode associated with the other storage site.

11. A charge transfer device as claimed in claim 1 or 2, characterized in that the projection extends from the strip-shaped part of the transfer electrode over a distance beyond the periphery of the one storage site, which distance is at most equal to about half the width of the connection channel at the area of the one end joining the one storage site.

* * * * *